United States Patent
Kan et al.

(10) Patent No.: US 10,134,808 B2
(45) Date of Patent: Nov. 20, 2018

(54) MAGNETIC TUNNEL JUNCTION (MTJ) DEVICES WITH HETEROGENEOUS FREE LAYER STRUCTURE, PARTICULARLY SUITED FOR SPIN-TORQUE-TRANSFER (STT) MAGNETIC RANDOM ACCESS MEMORY (MRAM) (STT MRAM)

(71) Applicant: QUALCOMM Incorporated, San Diego, CA (US)

(72) Inventors: Jimmy Jianan Kan, San Diego, CA (US); Chando Park, Irvine, CA (US); Matthias Georg Gottwald, Yorktown Heights, NY (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/137,437

(22) Filed: Apr. 25, 2016

(65) Prior Publication Data

US 2017/0125481 A1 May 4, 2017

(51) Int. Cl.
*H01L 27/22* (2006.01)
*G11C 11/16* (2006.01)
(Continued)

(52) U.S. Cl.
CPC .......... *H01L 27/228* (2013.01); *G11C 11/161* (2013.01); *H01L 43/02* (2013.01);
(Continued)

(58) Field of Classification Search
CPC .................................................... H01L 27/228
(Continued)

(56) References Cited

U.S. PATENT DOCUMENTS 7,081,658 B2 7/2006 Worledge et al.
8,422,285 B2 4/2013 Apalkov et al.
(Continued)

FOREIGN PATENT DOCUMENTS

JP 2004158766 A 6/2004

OTHER PUBLICATIONS

International Search Report and Written Opinion for PCT/US2016/055287, dated Jan. 4, 2017, 13 pages.
(Continued)

*Primary Examiner* — Igwe U Anya
(74) *Attorney, Agent, or Firm* — W&T/Qualcomm

(57) ABSTRACT

Magnetic tunnel junction (MTJ) devices with a heterogeneous free layer structure particularly suited for efficient spin-torque-transfer (STT) magnetic random access memory (MRAM) (STT MRAM) are disclosed. In one aspect, a MTJ structure with a reduced thickness first pinned layer section provided below a first tunnel magneto-resistance (TMR) barrier layer is provided. The first pinned layer section includes one pinned layer magnetized in one magnetic orientation. In another aspect, a second pinned layer section and a second TMR barrier layer are provided above a free layer section and above the first TMR barrier layer in the MTJ. The second pinned layer is magnetized in a magnetic orientation that is anti-parallel (AP) to that of the first pinned layer section. In yet another aspect, the free layer comprises first and second heterogeneous layers separated by an antiferromagnetic coupling spacer, the first and second heterogeneous layers differing in their magnetic anisotropy.

27 Claims, 10 Drawing Sheets

(51) Int. Cl.
*H01L 43/02* (2006.01)
*H01L 43/08* (2006.01)
*H01L 43/10* (2006.01)
*H01L 43/12* (2006.01)

(52) U.S. Cl.
CPC .............. *H01L 43/08* (2013.01); *H01L 43/10* (2013.01); *H01L 43/12* (2013.01)

(58) Field of Classification Search
USPC ........................................................ 257/252
See application file for complete search history.

(56) References Cited

U.S. PATENT DOCUMENTS

| | | | |
|---|---|---|---|
| 8,698,260 B2 | 4/2014 | Jan et al. | |
| 2002/0034057 A1* | 3/2002 | Noma .................... | B82Y 10/00 360/324.12 |
| 2005/0219769 A1* | 10/2005 | Shimura ................ | B82Y 10/00 360/324.2 |
| 2005/0270702 A1* | 12/2005 | Komagaki .............. | G11B 5/39 360/319 |
| 2010/0174766 A1* | 7/2010 | Weeks .................... | G06F 7/588 708/255 |
| 2010/0271870 A1 | 10/2010 | Zheng et al. | |
| 2011/0062536 A1* | 3/2011 | Min ........................ | B82Y 25/00 257/421 |
| 2012/0063221 A1 | 3/2012 | Yamane et al. | |
| 2012/0069474 A1 | 3/2012 | Takagishi et al. | |
| 2012/0155164 A1* | 6/2012 | Shukh .................... | H01L 43/08 365/171 |
| 2012/0313191 A1 | 12/2012 | Whig et al. | |
| 2013/0075845 A1* | 3/2013 | Chen ..................... | G11C 11/161 257/421 |
| 2013/0148418 A1* | 6/2013 | Luo ..................... | G11C 11/1675 365/158 |
| 2013/0230741 A1* | 9/2013 | Wang ....................... | G11B 5/82 428/826 |
| 2014/0061828 A1* | 3/2014 | Lim ........................ | H01L 43/08 257/421 |
| 2014/0103470 A1* | 4/2014 | Shukh .................... | H01L 29/82 257/421 |
| 2014/0151831 A1* | 6/2014 | Chen ....................... | H01L 43/08 257/427 |
| 2014/0159175 A1 | 6/2014 | Lee et al. | |
| 2014/0264671 A1* | 9/2014 | Chepulskyy ............ | H01L 43/08 257/421 |

OTHER PUBLICATIONS

Yulaev, I. et al., "Spin-transfer-torque reversal in perpendicular anisotropy spin valves with composite free layers," Applied Physics Letters, vol. 99, No. 13, 2011, p. 132502.

Second Written Opinion for PCT/US2016/055287, dated Oct. 17, 2017, 5 pages.

International Preliminary Report on Patentability for PCT/US2016/055287, dated Jan. 29, 2018, 21 pages.

* cited by examiner

MAGNETIC TUNNEL JUNCTION (MTJ) DEVICES WITH HETEROGENEOUS FREE LAYER STRUCTURE, PARTICULARLY SUITED FOR SPIN-TORQUE-TRANSFER (STT) MAGNETIC RANDOM ACCESS MEMORY (MRAM) (STT MRAM)

PRIORITY APPLICATION

The present application claims priority under 35 U.S.C. § 119(e) to U.S. Provisional Patent Application Ser. No. 62/249,761, filed on Nov. 2, 2015, and entitled "MAGNETIC TUNNEL JUNCTION (MTJ) DEVICES WITH HETEROGENEOUS FREE LAYER STRUCTURE, PARTICULARLY SUITED FOR SPIN-TORQUE-TRANSFER (STT) MAGNETIC RANDOM ACCESS MEMORY (MRAM) (STT MRAM)," which is incorporated herein by reference in its entirety.

BACKGROUND

I. Field of the Disclosure

The technology of the disclosure relates generally to the structure of magnetic tunnel junction (MTJ) devices that can be used, for example, in magnetic random access memory (MRAM).

II. Background

Semiconductor storage devices are used in integrated circuits (ICs) in electronic devices to provide data storage. One example of a semiconductor storage device is a magnetic random access memory (MRAM). MRAM is non-volatile memory in which data is stored by programming a magnetic tunnel junction (MTJ) as part of a MRAM bit cell. One advantage of a MRAM is that MTJs in MRAM bit cells can retain stored information even when power is turned off. Data is stored in the MTJ as a small magnetic element rather than as an electric charge or current.

In this regard, FIG. 1 is an illustration of a perpendicular MTJ (pMTJ) 100 provided in a MRAM bit cell to store data as a function of magnetic orientation of a free layer and a pinned layer in the MTJ 100. Data is stored in the MTJ 100 according to the magnetic orientation between two layers: a free layer 102 and a pinned layer 104. In the MTJ 100, the free and pinned layers 102, 104 are formed from a ferromagnetic material with perpendicular magnetic anisotropy (i.e., the magnetic orientation of the ferromagnetic material is perpendicular to a layer plane) to form a pMTJ. The MTJ 100 is configured in a "bottom-spin valve" configuration wherein the pinned layer 104 is located below the free layer 102. The free and pinned layers 102, 104 are separated by a tunnel junction or tunnel barrier layer 106, formed by a thin non-magnetic dielectric layer. Electrons in a tunneling current can tunnel through the tunnel barrier layer 106 if a bias voltage is applied between two electrodes 110, 112 coupled on ends of the MTJ 100. The tunneling current depends on the relative magnetic orientation of the free layer 102 and the pinned layer 104. When using a spin-torque-transfer (STT) MTJ (not shown), the difference in the tunneling current, as the spin alignment of the free and pinned layers 102, 104 is switched between being parallel (P) and anti-parallel (AP), is known as a tunnel magneto-resistance (TMR) ratio.

The free and pinned layers 102, 104 can store information even when a magnetic H-field is "0" due to a hysteresis loop 108 of the MTJ 100. When the magnetic orientation of the free and pinned layers 102, 104 is AP (shown in FIG. 1 as MTJ 100'), a first memory state exists (e.g., a logical "1"; also referred to herein as "AP state") that can be detected as a high magneto-resistance (MR) across the MTJ 100. When the magnetic orientation of the free and pinned layers 102, 104 is P (shown in FIG. 1 as MTJ 100"), a second memory state exists (e.g., a logical "0"; also referred to herein as "P state") that can be detected as a low MR across the MTJ 100. Accordingly, data stored in the MTJ 100 can be read by sensing the resistance across the MTJ 100 when current flows through the MTJ 100. In that regard, when reading data stored in the MTJ 100, a read voltage differential is applied between the electrodes 110, 112 to allow current to flow through the MTJ 100. A low resistance, as measured by a voltage differential between the electrodes 110, 112 divided by a measured current, is associated with the P magnetic orientation between the free and pinned layers 102, 104, and thus, the MTJ 100 is considered to be in the P state. A high resistance is associated with the AP magnetic orientation between the free and pinned layers 102, 104, and thus, the MTJ 100 is considered to be in the AP state.

Furthermore, data can be written and stored in the MTJ 100 by applying a magnetic field or electrical current to change the magnetic orientation of the free layer 102 to either be P or AP relative to the pinned layer 104. The magnetic orientation of the free layer 102 can be changed, but the magnetic orientation of the pinned layer 104 is fixed. In that regard, when writing data to the MTJ 100, a write voltage differential is applied between the electrodes 110, 112 to generate a write current through the MTJ 100. If the state of the MTJ 100 is to be changed from the P state to the AP state, the write current ($I_{P-AP}$) flowing from the top electrode 110 to the bottom electrode 112 is produced to induce the STT at the free layer 102 to change the magnetic orientation of the free layer 102 to be AP with respect to the pinned layer 104. With respect to FIG. 1, this change from the P state to the AP state can be described as a change from the magnetic orientation illustrated for MTJ 100" to the magnetic orientation illustrated for MTJ 100'. If, on the other hand, the state is to be changed from the AP state to the P state, the write current ($I_{AP-P}$) flowing from the bottom electrode 112 to the top electrode 110 is generated to induce the STT at the free layer 102 to change the magnetic orientation of the free layer 102 to be P with respect to the pinned layer 104. With respect to FIG. 1, this change from the AP state to the P state can be described as a change from the magnetic orientation illustrated for MTJ 100' to the magnetic orientation illustrated for MTJ 100".

FIG. 2 is a schematic diagram illustrating the magnetization of a MTJ 200. The MTJ 200 includes a MTJ stack structure 202 that can be employed in the MTJ 100 in FIG. 1. The MTJ stack structure 202 includes a bottom electrode 204, a pinned layer section 206, an anti-ferromagnetically coupled (AFC) spacer layer 208, a polarization enhancing layer 210, a tunnel magneto-resistance (TMR) barrier layer 212, a free layer 214, and a top electrode 216. In the MTJ stack structure 202, the magnetic orientation of the pinned layer section 206 is fixed. Accordingly, the pinned layer section 206 generates a constant magnetic field that may affect, or "bias," a magnetic orientation of the free layer 214. This magnetic field bias, at best, can cause an asymmetry in the magnitude of current necessary to change the magnetic orientation of the free layer 214 (i.e., $I_{P-AP}$ is different from $I_{AP-P}$). The current necessary to change the magnetic orientation towards a bias magnetic orientation is reduced, while the current necessary to change the magnetic orientation of the free layer 214 against the bias magnetic orientation is increased. At worst, this magnetic field bias can be strong enough to "flip" the value of a MRAM bit cell employing the MTJ 200 in FIG. 2, thus decreasing the reliability of the subject MRAM. In this regard, the pinned layer section 206 includes a synthetic anti-ferromagnetic (SAF) structure 218, wherein the pinned layer section 206 includes a first AP layer, AP1 layer 220, and a second AP layer, AP2 layer 222. These first and second AP layers, AP1 layer 220 and AP2 layer 222, are permanently magnetized and magnetically coupled in opposite magnetic orientations to generate opposing magnetic fields. The opposing magnetic fields produce a zero or near zero net magnetic field towards the free layer 214, thus reducing the magnetic field bias problem at the free layer 214.

Because the SAF structure 218 of the MTJ 200 in FIG. 2 that forms the pinned layer section 206 includes first and second AP layers, AP1 layer 220 and AP2 layer 222, located below the TMR barrier layer 212, the pinned layer section 206 below the TMR barrier layer 212 is thicker than if it included only one pinned layer. Specifically, each of the first and second AP layers, AP1 layer 220 and AP2 layer 222, can include multiple sublayers (e.g., a Cobalt (Co)-Platinum (Pt)-Cobalt (Co) film), each sublayer of a minimum thickness in order to be effective. During fabrication, imperfections or variations due to uneven deposition of materials across the planes of the layers can propagate through the structure, thus creating a "rough" surface at a base 224 of the TMR barrier layer 212. The thicker the area under the TMR barrier layer 212, the more likely "roughness" will be present at the base 224 of the TMR barrier layer 212. Because the TMR barrier layer 212 is a relatively thin layer (e.g., 5-10 angstroms), roughness at the base 224 of the TMR barrier layer 212 may degrade the functionality of the MTJ 200 by reducing the MTJ 200 TMR ratio.

SUMMARY OF THE DISCLOSURE

Aspects disclosed in the detailed description include magnetic tunnel junction (MTJ) devices with a heterogeneous free layer structure. The MTJ devices are particularly suited for efficient spin-torque-transfer magnetic random access memory (STT MRAM) as a non-limiting example. In this regard, in certain exemplary aspects disclosed herein, a pinned layer section in a MTJ provided below a first tunnel magneto-resistance (TMR) layer includes one pinned layer magnetized in one magnetic orientation, instead of including two anti-parallel (AP) layers. In this manner, unevenness or roughness at the junction between a first pinned layer section and a first TMR layer located over the first pinned layer section, which can be caused by propagated imperfections or variations in the fabrication process of the first pinned layer section, can be reduced to avoid reducing a TMR ratio of the first TMR layer. Further, a second pinned layer section and a second TMR layer are above the free layer and the first TMR layer in the MTJ. The second pinned layer is magnetized in a magnetic orientation that is AP to that of the pinned layer below the first TMR layer. This configuration can reduce the net magnetic field (i.e., bias) on the free layer from the pinned layer located below the TMR layer, thus providing higher field stability and enhanced data retention. This configuration can also provide a more efficient spin torque polarization when switching between a parallel (P) state and an AP state, which results in reduced overall write current and reduced write current asymmetry. This configuration is also scalable with size as MTJ diameter is reduced without substantial engineering of materials and/or corresponding thicknesses.

In such a configuration, the magneto-resistance of the second TMR layer is made to differ from the magneto-resistance of the first TMR layer such that an orientation of the corresponding free layer can be detected to detect data stored therein. However, processes for fabricating the MTJ such that the magneto-resistances of the first and second TMR layers are reliably controlled can be complex and unreliable. In this regard, in another aspect, the free layer of the MTJ includes first and second heterogeneous free layers separated by an anti-ferromagnetic coupling spacer layer that is configured to anti-ferromagnetically couple the first and second heterogeneous free layers. The first and second heterogeneous free layers are heterogeneous by virtue of having different magnetic anisotropies relative to each other. The anti-ferromagnetic coupling of the first and second heterogeneous free layers caused by the anti-ferromagnetic coupling spacer layer forces the heterogeneous free layer with the lowest magnetic anisotropy (referred to also as a "soft" layer) to adopt a magnetic orientation that is opposite to that of the heterogeneous free layer with the highest magnetic anisotropy (referred to also as a "hard" layer). Accordingly, when exposed to magnetic fields and polarized current, the magnetic orientation of the hard layer is altered accordingly, and the magnetic orientation of the soft layer naturally becomes anti-parallel to the magnetic orientation of the hard layer. As a whole, the magnetic orientation of the free layer is that of the hard layer. However, by including the anti-ferromagnetically coupled hard and soft layers, the orientation of the free layer as a whole can be detected, and therefore, data stored therein can be determined. Because the free layer, as described above, includes the first and second heterogeneous layers, the free layer is referred to hereinafter as a free layer section.

The positions of the hard and soft layers of the free layer section within the MTJ allows for the magnetic orientation of the free layer section, as a whole, to be detected when the first and second TMR layers are of same or similar magneto-resistance. Accordingly, this configuration obviates the need to fabricate the MTJ such that the first and second TMR layers therein are of different magneto-resistances, thus reducing complexity and increasing structural symmetry, while allowing for the orientation of the free layer section, and thus the data stored therein, to be detected. Furthermore, because the first and second heterogeneous layers support each other in maintaining their corresponding magnetic orientations, this configuration can provide higher thermal stability, and therefore, enhanced data retention.

In this regard in one aspect, a MTJ is provided. The MTJ comprises a first electrode, a second electrode, and a first tunnel barrier layer between the first electrode and the second electrode. The first tunnel barrier layer is configured to provide a first magneto-resistance between a first pinned layer and a free layer section when the first pinned layer is AP to the free layer section. The first pinned layer is between the first tunnel barrier layer and the first electrode and is configured to provide a first magnetization in a first magnetic orientation between the first tunnel barrier layer and the first electrode. The MTJ further comprises the free layer section between the second electrode and the first tunnel barrier layer. The free layer section comprises a first free layer comprising a first magnetic anisotropy, a second free layer comprising a second magnetic anisotropy that is different from the first magnetic anisotropy of the first free layer, and an anti-ferromagnetic coupling layer between the first free layer and the second free layer configured to anti-ferromagnetically couple the first free layer and the second free layer. The MTJ further comprises a second pinned layer between the second electrode and the free layer section. The second pinned layer is configured to provide a second magnetization in a second magnetic orientation that is AP to the first magnetic orientation. The MTJ further comprises a second tunnel barrier layer between the second pinned layer and the free layer section. The second tunnel barrier layer is configured to provide a second magneto-resistance between the second pinned layer and the free layer section when the second pinned layer is AP to the free layer section.

In another aspect, the first magneto-resistance of the first tunnel barrier layer is substantially similar to the second magneto-resistance of the second tunnel barrier layer. In yet another aspect, the first magnetic orientation of the first magnetization of the first pinned layer is perpendicular to a plane of the first pinned layer, and the second magnetic orientation of the second magnetization of the second pinned layer is perpendicular to a plane of the second pinned layer.

In another aspect, a method of forming a MTJ is provided. The method comprises providing a first electrode and a second electrode, disposing a first tunnel barrier layer between the first electrode and the second electrode, and disposing a first pinned layer between the first tunnel barrier layer and the first electrode. The method further comprises disposing a free layer section between the second electrode and the first tunnel barrier layer. Disposing the free layer section comprises disposing a first free layer comprising a first magnetic anisotropy, a second free layer comprising a second magnetic anisotropy that is different from the first magnetic anisotropy, and an anti-ferromagnetic coupling layer between the first free layer and the second free layer configured to anti-ferromagnetically couple the first free layer and the second free layer. The method further comprises disposing a second pinned layer between the second electrode and the free layer section and disposing a second tunnel barrier layer between the second pinned layer and the free layer section.

In another aspect, a MRAM bit cell is provided. The MRAM bit cell comprises an access transistor, which has a gate, a source, and a drain. The MRAM bit cell further comprises a MTJ. The MTJ comprises a first electrode, a second electrode, and a first tunnel barrier layer between the first electrode and the second electrode. The first tunnel barrier layer is configured to provide a first magneto-resistance between a first pinned layer and a free layer section when the first pinned layer is AP to the free layer section. The first pinned layer is between the first tunnel barrier layer and the first electrode and is configured to provide a first magnetization in a first magnetic orientation between the first tunnel barrier layer and the first electrode. The MTJ further comprises the free layer section between the second electrode and the first tunnel barrier layer. The free layer section comprises a first free layer comprising a first magnetic anisotropy, a second free layer comprising a second magnetic anisotropy that is different from the first magnetic anisotropy, and an anti-ferromagnetic coupling layer between the first free layer and the second free layer configured to anti-ferromagnetically couple the first free layer and the second free layer. The MTJ further comprises a second pinned layer between the second electrode and the free layer section. The second pinned layer is configured to provide a second magnetization in a second magnetic orientation that is AP to the first magnetic orientation. The MTJ further comprises a second tunnel barrier layer between the second pinned layer and the free layer section. The second tunnel barrier layer is configured to provide a second magneto-resistance between the second pinned layer and the free layer section when the second pinned layer is AP to the free layer section. In the MRAM bit cell, a word line is coupled to the gate. The second electrode is coupled to the drain, and a bit line is coupled to the first electrode.

In another aspect, a MTJ is provided. The MTJ comprises a first electrode, a second electrode, and a first tunnel barrier layer between the first electrode and the second electrode. The first tunnel barrier layer comprises Magnesium Oxide (MgO). The MTJ further comprises a first pinned layer between the first tunnel barrier layer and the first electrode. The first pinned layer comprises Cobalt (Co) and at least one of Platinum (Pt), Nickel (Ni), and Palladium (Pd), and the first pinned layer is configured to provide a first magnetization in a first magnetic orientation between the first tunnel barrier layer and the first electrode. The MTJ further comprises a free layer section between the second electrode and the first tunnel barrier layer. The free layer section comprises a first free layer comprising Cobalt (Co), Iron (Fe), and Boron (B), and the first free layer is configured to a first magnetic anisotropy. The free layer section further comprises a second free layer comprising Co, Fe, and B, and the second free layer is configured to a second magnetic anisotropy that is different from the first magnetic anisotropy. The free layer section further comprises an anti-ferromagnetic coupling layer between the first free layer and the second free layer and configured to anti-ferromagnetically couple the first free layer and the second free layer. The MTJ further comprises a second pinned layer between the second electrode and the free layer section, the second pinned layer configured to provide a second magnetization in a second magnetic orientation that is AP to the first magnetic orientation.

DETAILED DESCRIPTION

Figure 1:
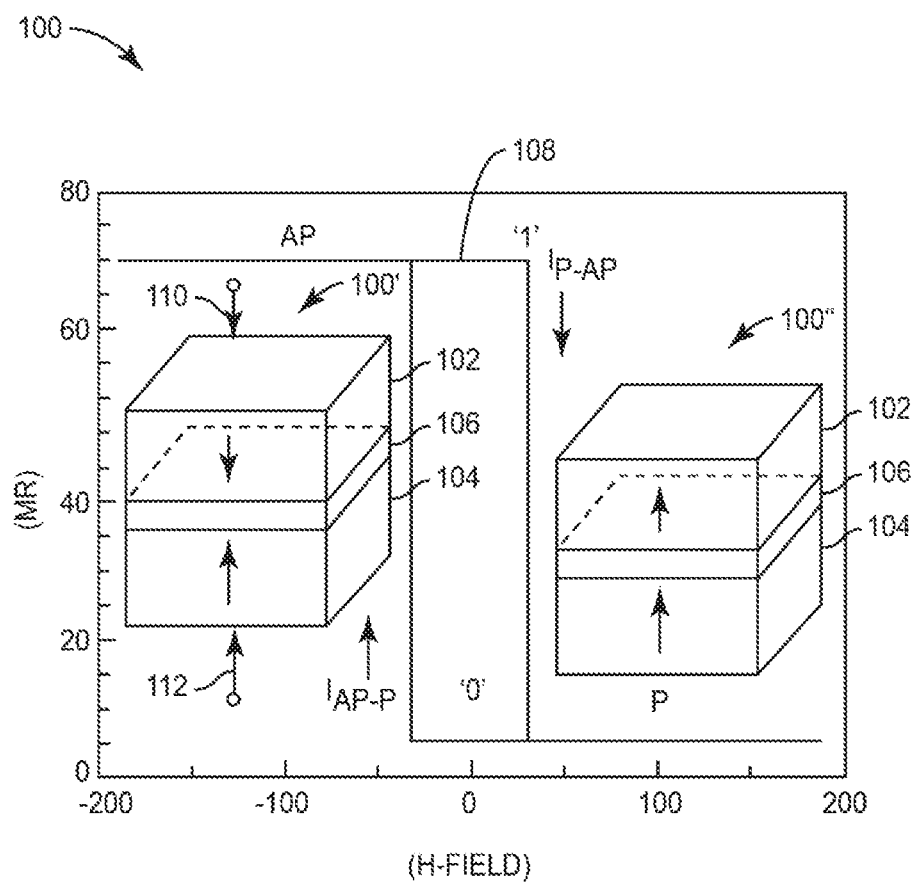
FIG. 1 is an illustration of a perpendicular magnetic tunnel junction (MTJ) provided in a magnetic random access memory (MRAM) bit cell to store data as a function of a magnetic orientation of a free layer and a pinned layer in the MTJ.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include magnetic tunnel junction (MTJ) devices with a heterogeneous free layer structure. The MTJ devices are particularly suited for efficient spin-torque-transfer magnetic random access memory (STT MRAM) as a non-limiting example. In this regard, in certain exemplary aspects disclosed herein, a pinned layer section in a MTJ provided below a first tunnel magneto-resistance (TMR) layer includes one pinned layer magnetized in one magnetic orientation, instead of including two anti-parallel (AP) layers. In this manner, unevenness or roughness at the junction between a first pinned layer section and a first TMR layer located over the first pinned layer section, which can be caused by propagated imperfections or variations in the fabrication process of the first pinned layer section, can be reduced to avoid reducing a TMR ratio of the first TMR layer. Further, a second pinned layer section and a second TMR layer are above the free layer and the first TMR layer in the MTJ. The second pinned layer is magnetized in a magnetic orientation that is AP to that of the pinned layer below the first TMR layer. This configuration can reduce the net magnetic field (i.e., bias) on the free layer from the pinned layer located below the TMR layer, thus providing higher field stability and enhanced data retention. This configuration can also provide a more efficient spin torque polarization when switching between a parallel (P) state and a AP state, which results in reduced overall write current and reduced write current asymmetry. This configuration is also scalable with size as MTJ diameter is reduced without substantial engineering of materials and/or corresponding thicknesses.

In such a configuration, the magneto-resistance of the second TMR layer is made to differ from the magneto-resistance of the first TMR layer such that an orientation of the corresponding free layer can be detected to detect data stored therein. However, fabricating the MTJ such that the magneto-resistances of the first and second TMR layers are reliably controlled can be complex and unreliable. In this regard, in another aspect, the free layer of the MTJ comprises first and second heterogeneous free layers separated by an anti-ferromagnetic coupling spacer layer that is configured to anti-ferromagnetically couple the first and second heterogeneous free layers. The first and second heterogeneous free layers are heterogeneous by virtue of having different magnetic anisotropies relative to each other. The anti-ferromagnetic coupling of the first and second heterogeneous free layers caused by the anti-ferromagnetic coupling spacer layer forces the heterogeneous free layer with the lowest magnetic anisotropy (referred to also as a "soft" layer) to adopt a magnetic orientation that is opposite to that of the heterogeneous free layer with the highest magnetic anisotropy (referred to also as a "hard" layer). Accordingly, when exposed to magnetic fields and polarized current, the magnetic orientation of the hard layer is altered accordingly, and the magnetic orientation of the soft layer naturally becomes AP to the magnetic orientation of the hard layer. As a whole, the magnetic orientation of the free layer as a whole is that of the hard layer. However, by including the anti-ferromagnetically coupled hard and soft layers, the orientation of the free layer as a whole can be detected, and therefore, data stored therein can be determined. Because the free layer, as described above, includes the first and second heterogeneous layers, the free layer is referred to hereinafter as a free layer section.

The position of the hard and soft layers of the free layer section within the MTJ allows for the magnetic orientation of the free layer section, as a whole, to be detected when the first and second TMR layers are of same or similar magneto-resistance. Accordingly, this configuration obviates the need to fabricate the MTJ such that the first and second TMR layers therein are of different magneto-resistances, thus reducing complexity and increasing structural symmetry, while allowing for the orientation of the free layer section, and thus the data stored therein, to be detected. Furthermore, because the first and second heterogeneous layers support each other in maintaining their corresponding magnetic orientations, this configuration can provide higher thermal stability, and therefore, enhanced data retention.

Figure 3:
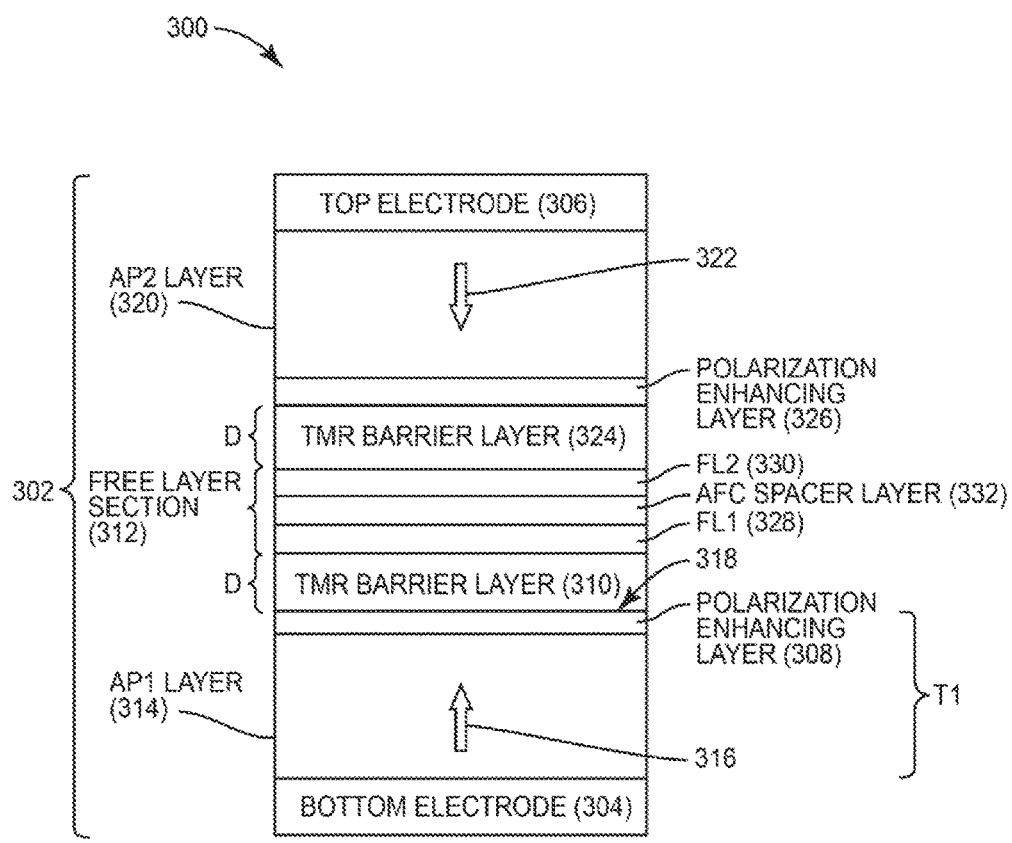
FIG. 3 is a schematic diagram of an exemplary MTJ that includes a reduced thickness pinned layer to reduce unevenness or roughness at the base of a first tunnel magneto-resistance (TMR) layer and a free layer section, including heterogeneous free layers that are anti-ferromagnetically coupled, for efficient spin-torque transfer.

In this regard, FIG. 3 is a schematic diagram of an exemplary MTJ 300 that includes a reduced thickness pinned layer to reduce unevenness or roughness at the base of a first TMR layer and a free layer section, including heterogeneous free layers that are anti-ferromagnetically coupled, for efficient spin-torque transfer. The MTJ 300 includes an exemplary MTJ stack structure 302. The MTJ stack structure 302 includes a bottom electrode 304 and a top electrode 306. The MTJ stack structure 302 further includes a polarization enhancing layer 308, a first TMR barrier layer 310 (also referred to herein as a first tunnel barrier layer), and a free layer section 312. The first TMR barrier layer 310 is located between the bottom electrode 304 and the top electrode 306. The first TMR barrier layer 310 comprises a non-conductive material that provides a first magneto-resistance that is a high magneto-resistance between a first AP pinned layer 314 of the MTJ stack structure 302 (also referred to herein as "AP1 layer 314") and the free layer section 312, when the magnetic orientation of the AP1 layer 314 is AP to that of the free layer section 312. This is due to a TMR effect created by the combination of the free layer section 312, the first TMR barrier layer 310, and the AP1 layer 314 within the MTJ stack structure 302. A TMR effect is a change in electrical resistance, by virtue of a tunneling of electrons through the first TMR barrier layer 310, depending on whether the magnetic orientation of the adjacent free layer section 312 and the AP1 layer 314 are in a P or an AP alignment.

With continuing reference to FIG. 3, the MTJ stack structure 302 further includes the AP1 layer 314 located between the first TMR barrier layer 310 and the bottom electrode 304. The AP1 layer 314 is configured to provide a true reference/fixed layer for the magneto-resistance functionality of the first TMR barrier layer 310 between the AP1 layer 314 and the free layer section 312. The AP1 layer 314 is configured to provide a first magnetization in a first magnetic orientation 316 between the first TMR barrier layer 310 and the bottom electrode 304.

Having a pinned layer section below the first TMR barrier layer 310 in the MTJ 300 that includes one AP pinned layer (i.e., the AP1 layer 314) allows for a reduction of the thickness under the first TMR barrier layer 310 relative to a MTJ stack structure that has two AP pinned layers located under a TMR barrier layer, such as in, for example, the MTJ stack structure 202 illustrated in FIG. 2. Including one AP layer, like AP1 layer 314 in the MTJ stack structure 302, may reduce the probability and/or the degree of roughness at a base 318 of the first TMR barrier layer 310, thus avoiding a reduction in a TMR ratio relative to that of the MTJ stack structure 202 in FIG. 2 as an example. This is because the thicker the area under the first TMR barrier layer 310, the more likely "roughness" will be present at the base 318 of the first TMR barrier layer 310. Roughness at the base 318 of the first TMR barrier layer 310 may degrade the functionality of the first TMR barrier layer 310 and thus reduce the TMR ratio of the MTJ stack structure 302.

However, because the AP1 layer 314 is magnetized in the first magnetic orientation 316, the magnetic field of the AP1 layer 314 can bias the magnetic orientation of the free layer section 312 towards the first magnetic orientation 316, thus reducing the reliability and/or the usability of the MTJ 300. In this regard, the MTJ stack structure 302 in FIG. 3 includes a second AP pinned layer 320 (also referred to herein as "AP2 layer 320") located between the top electrode 306 and the first TMR barrier layer 310. The free layer section 312 is located between the AP2 layer 320 and the first TMR barrier layer 310. The AP2 layer 320 in this example is provided a second magnetization in a second magnetic orientation 322 that is AP to the first magnetic orientation 316 to counter the magnetization in the first magnetic orientation 316, balance a stray field emitted from the AP1 layer 314, and reduce the net magnetic field on the free layer section 312 to zero or near zero, thus providing higher field stability and enhanced data retention. Accordingly, in the MTJ stack structure 302, a thickness T1 of the AP1 layer 314 below the first TMR barrier layer 310 is less than in the pinned layer section 206 structure provided below the TMR barrier layer 212 in the MTJ stack structure 202 illustrated in FIG. 2. This reduces the probability and/or the degree of roughness at the base 318 of the first TMR barrier layer 310 while maintaining control over of the net magnetic field at the free layer section 312 created by the AP1 layer 314.

Figure 2:
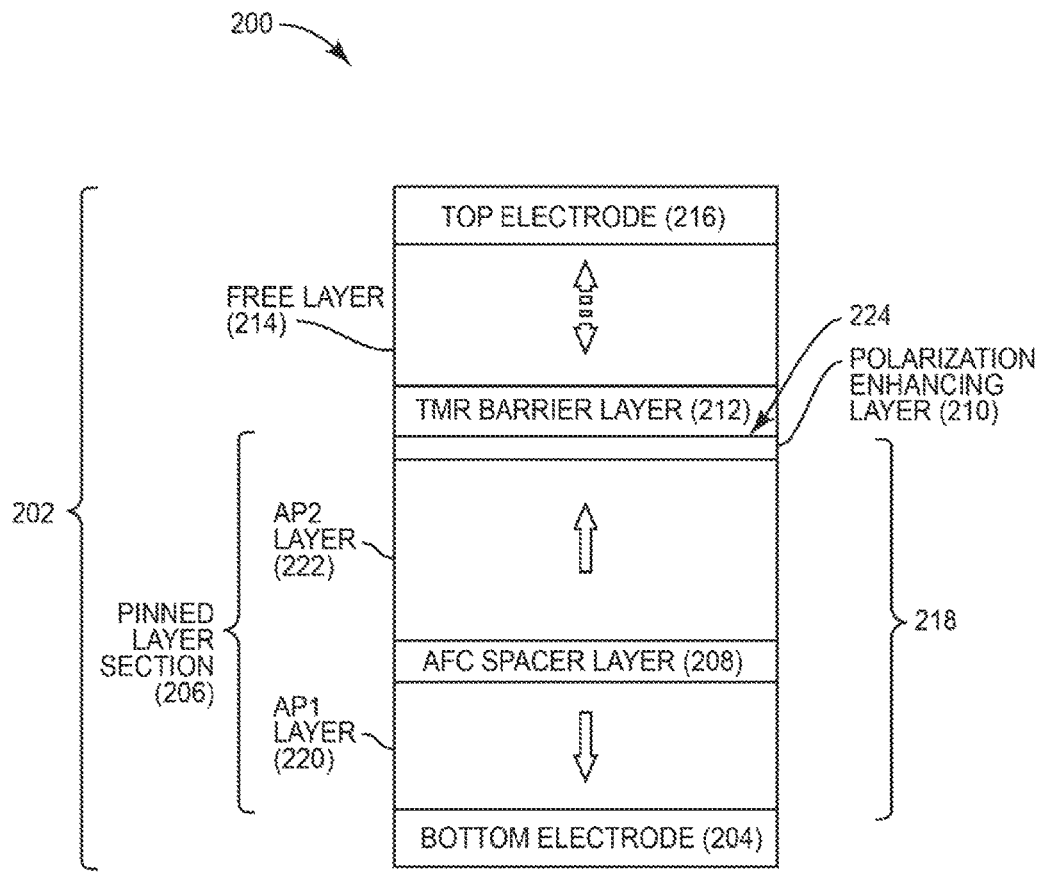
FIG. 2 is a schematic diagram illustrating magnetization of a MTJ.

Another aspect of the MTJ stack structure 302 in FIG. 3 is that, because the AP1 layer 314 and the AP2 layer 320 can be located at a similar distance D from the free layer section 312, designing the AP1 and AP2 layers 314, 320 to control the net magnetic field on the free layer section 312 and to control any future scaling of the AP1 layer 314 and the AP2 layer 320 is easier than for the MTJ stack structure 202 illustrated in FIG. 2. In detail, in the MTJ stack structure 202 illustrated in FIG. 2, the AP1 layer 220 and the AP2 layer 222 are located below the TMR barrier layer 212. The AP1 layer 220 and the AP2 layer 222 are configured to generate zero or near zero net magnetic field at the free layer 214 to maintain a low bias magnetic orientation. However, the magnitude of the magnetic field that each of the AP1 layer 220 and the AP2 layer 222 generates on the free layer 214 is a function of their respective size and of their respective distance from the free layer 214. As illustrated in FIG. 2, in the MTJ stack structure 202, the AP1 layer 220 is located further away from the free layer 214 than the AP2 layer 222. Therefore, determining the correct size of each of the AP1 layer 220 and the AP2 layer 222, as well as reducing their corresponding size when seeking to downscale the MTJ stack structure 202, requires a complex redesign/readjustment of the size of each of the AP1 layer 220 and the AP2 layer 222.

In contrast, in the MTJ stack structure 302 illustrated in FIG. 3, the AP1 layer 314 and the AP2 layer 320 are located at a similar distance D from the free layer section 312 (the AP1 layer 314 is below the free layer section 312, and the AP2 layer 320 is above the free layer section 312). Accordingly, determining the correct size of each of the AP1 layer 314 and the AP2 layer 320 to control the net magnetic field on the free layer section 312, and downscaling the MTJ stack structure 302, is easier than for the MTJ stack structure 202 illustrated in FIG. 2.

Furthermore, the AP2 layer 320 in the MTJ stack structure in FIG. 3 is located above the free layer section 312 as part of a second magneto-resistive structure. In particular, the MTJ stack structure 302 further includes a second TMR barrier layer 324 (also referred to herein as a "second tunnel barrier layer") located between the AP2 layer 320 and the free layer section 312, and a corresponding polarization enhancing layer 326, to form the second magneto-resistive structure.

The second TMR barrier layer 324 in the MTJ stack structure 302 in FIG. 3, like the first TMR barrier layer 310, comprises a non-conductive material that provides a second magneto-resistance in the MTJ stack structure 302 that is a high magneto-resistance between the AP2 layer 320 and the free layer section 312, when the magnetic orientation of the AP2 layer 320 is AP to that of the free layer section 312.

As will be described in further detail with reference to FIG. 4 below, having the AP2 layer 320 as part of the second magneto-resistive structure increases the efficiency of switching the MTJ stack structure 302 from a P state to an AP state and from the AP state to the P state.

With reference back to the MTJ stack structure 302 in FIG. 3, the second TMR barrier layer 324 is similar in composition to the first TMR barrier layer 310, thus making the second magneto-resistive structure function according to the TMR effect. Accordingly, for the MTJ stack structure 302 to properly store data, certain properties of the MTJ stack structure 302 must be configured in concert. In detail, if the magneto-resistance at the second TMR barrier layer 324 is similar to that of the first TMR barrier layer 310, and the free layer section 312 is set as a homogeneous free layer (i.e. comprising a ferromagnetic material with a single magnetic anisotropy throughout), a voltage generated at the MTJ stack structure 302 in response to a read current when the MTJ stack structure 302 is in the P state will be substantially similar to the voltage generated at the MTJ stack structure 302 in response to the read current when the MTJ stack structure 302 is in the AP state. This is because, regardless of the orientation of the free layer section 312, one of the first TMR barrier layer 310 and the second TMR barrier layer 324 will have an adjacent pinned layer from the AP1 and AP2 layers 314, 320 that is P to the free layer section 312, while the other will have an adjacent pinned layer from the AP1 and AP2 layers 314, 320 that is AP to the free layer section 312. Thus, if the magneto-resistance at the second TMR barrier layer 324 is similar to the magneto-resistance at the first TMR barrier layer 310 and if the free layer section 312 is set as a homogeneous free layer, the orientation of the free layer section 312 cannot be easily determined, and the data stored in the MTJ 300 will not be readable. On the other hand, if the magneto-resistance of the second TMR barrier layer 324 is different from the magneto-resistance provided by the first TMR barrier layer 310, the voltage generated at the MTJ stack structure 302 in response to a read current when the MTJ stack structure 302 is in the P state will be substantially different to a voltage generated at the MTJ stack structure 302 in response to the read current when the MTJ stack structure 302 is in the AP state. However, fabricating and/or deposing the second TMR barrier layer 324 with a magneto-resistance that is different from the magneto-resistance of the first TMR barrier layer 310 adds complexity and unreliability to the MTJ 300.

In this regard, the free layer section 312 of the MTJ stack structure 302, located between the top electrode 306 and the first TMR barrier layer 310, includes a first free layer 328 (also referred to herein as "FL1 328") and a second free layer 330 (also referred to herein as "FL2 330"). The FL1 328 is structured to have a first magnetic anisotropy and the FL2 330 is structured to have a second magnetic anisotropy that is different from the first magnetic anisotropy. The magnetic anisotropy of the FL1 328 and the FL2 330 may be reliably altered by, for example, varying the thickness and/or the alloy composition of one of the free layers 328, 330 relative to the other. As an example, not as a limitation, the first magnetic anisotropy of the FL1 328 can be set to a Hk effective value that is 1000 units higher than the second magnetic anisotropy of the FL2 330, and thus the magnetic orientation of the FL1 328 is harder to switch (i.e., requires a larger spin torque/write current to switch from a magnetic orientation to an opposite magnetic orientation) than that of the FL2 330. As a result, the magnetic orientation of the FL1 328 becomes "hard" relative to the "soft" magnetic orientation of the FL2 330 and provides the magnetic orientation of the free layer section 312. The FL1 328 and the FL2 330 are separated by an anti-ferromagnetic coupling (AFC) spacer layer 332, thus making them anti-ferromagnetically coupled. Therefore, the magnetic orientation of FL2 330 (the "soft" free layer) becomes the opposite magnetic orientation of FL1 328 (the "hard" free layer).

Accordingly, because the magneto-resistance of the first and second TMR barrier layers 310, 324 depends on the strength of the magnetic orientation of the adjacent layers, data stored in the MTJ 300 (i.e., the magnetic orientation of the free layer section 312) can be read, even though the first and second TMR barrier layers 310, 324 are substantially similar. Furthermore, because the first and second TMR barrier layers 310, 324 are substantially similar, the MTJ stack structure 302 is more symmetrical than, for example, the MTJ stack structure 202 illustrated in FIG. 2, without adding design and/or fabrication complexity. Also, because the FL1 328 and the FL2 330 are anti-ferromagnetically coupled, they support each other in maintaining their corresponding magnetic orientations, thus providing higher thermal stability and enhanced data retention. Further still, as will be explained in further detail below, the MTJ stack structure 302 provides a reduction of write current asymmetry by virtue of a more efficient spin-torque-transfer than, for example, the MTJ stack structure 202 illustrated in FIG. 2.

Figure 4:
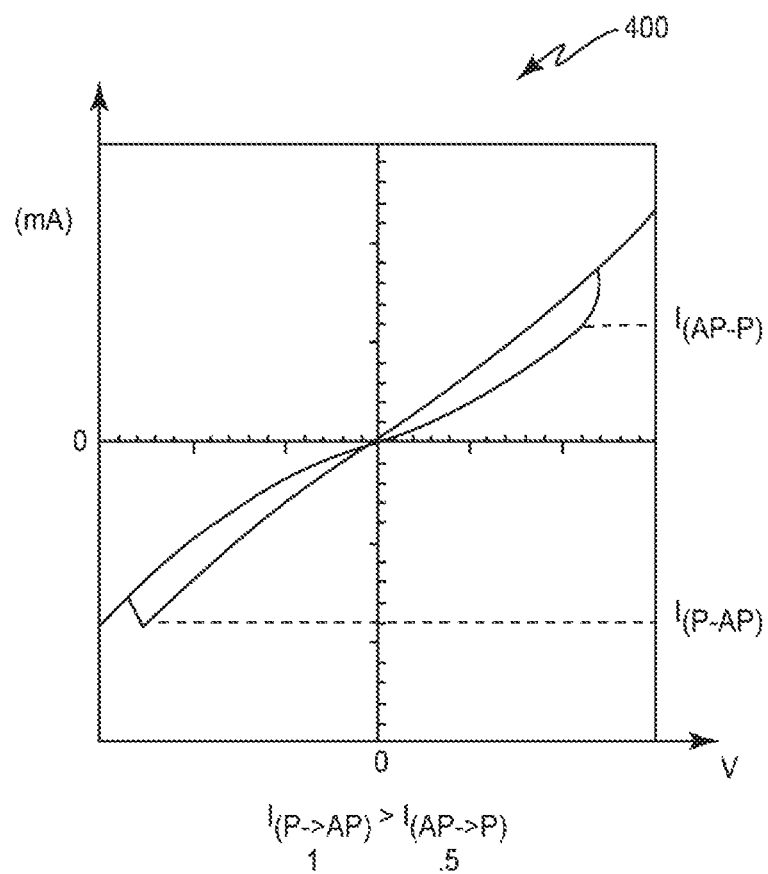
FIG. 4 is a graph illustrating a write current applied to the MTJ illustrated in FIG. 1 to write a memory state into the MTJ.

In this regard, FIG. 4 is a graph 400 illustrating a write current applied to the MTJ 100 illustrated in FIG. 1 to write a memory state therein. FIG. 4 will be described with reference to FIG. 1. The graph 400 illustrates that the amount of write current (I) required to switch the MTJ 100 from the P state to the AP state ($I_{P\text{-}AP}$) is much greater than the amount of I required to switch the MTJ 100 from the AP state to the P state ($I_{AP\text{-}P}$). This inherently occurs in the MTJ 100 because of the process by which the spin torque of the electrons in the corresponding I is polarized. Specifically, given the pinned layer 104 with a net magnetic orientation in the "up" direction (as illustrated in FIG. 1 for the MTJ 100), when switching the MTJ 100 from an AP state to a P state (i.e., switching the magnetic orientation of the free layer 102 from the "down" direction to the "up" direction), $I_{AP\text{-}P}$ flows from the bottom electrode 112 towards the top electrode 110. The electrons in $I_{AP\text{-}P}$ become polarized in the "up" direction as they move through the pinned layer 104 and the tunnel barrier layer 106 towards the free layer 102. Because both the pinned layer 104 and the tunnel barrier layer 106 contribute to the "up" polarization of the electrons, the polarization is generally efficient for switching the free layer 102 from the "down" polarization to the "up" polarization and, thus, the MTJ 100 from the AP state to the P state.

However, when switching the MTJ 100 from the P state to the AP state (i.e., switching the magnetic orientation of the free layer 102 from the "up" direction to the "down" direction), $I_{P\text{-}AP}$ flows from the top electrode 110 towards the bottom electrode 112. The electrons in $I_{P\text{-}AP}$ are not polarized in the "down" direction as they move through the free layer 102. The electrons in $I_{P\text{-}AP}$ become polarized in the "down" direction only as they are reflected from the tunnel barrier layer 106, and only those electrons that are reflected from the tunnel barrier layer 106 contribute towards switching the magnetic orientation of the free layer 102 to the "down" direction. This process requires more electrons, and therefore is much less efficient, than when switching the magnetic orientation from the AP state to the P state. Accordingly, $I_{P\text{-}AP}$ is larger than $I_{AP\text{-}P}$.

Figure 5:
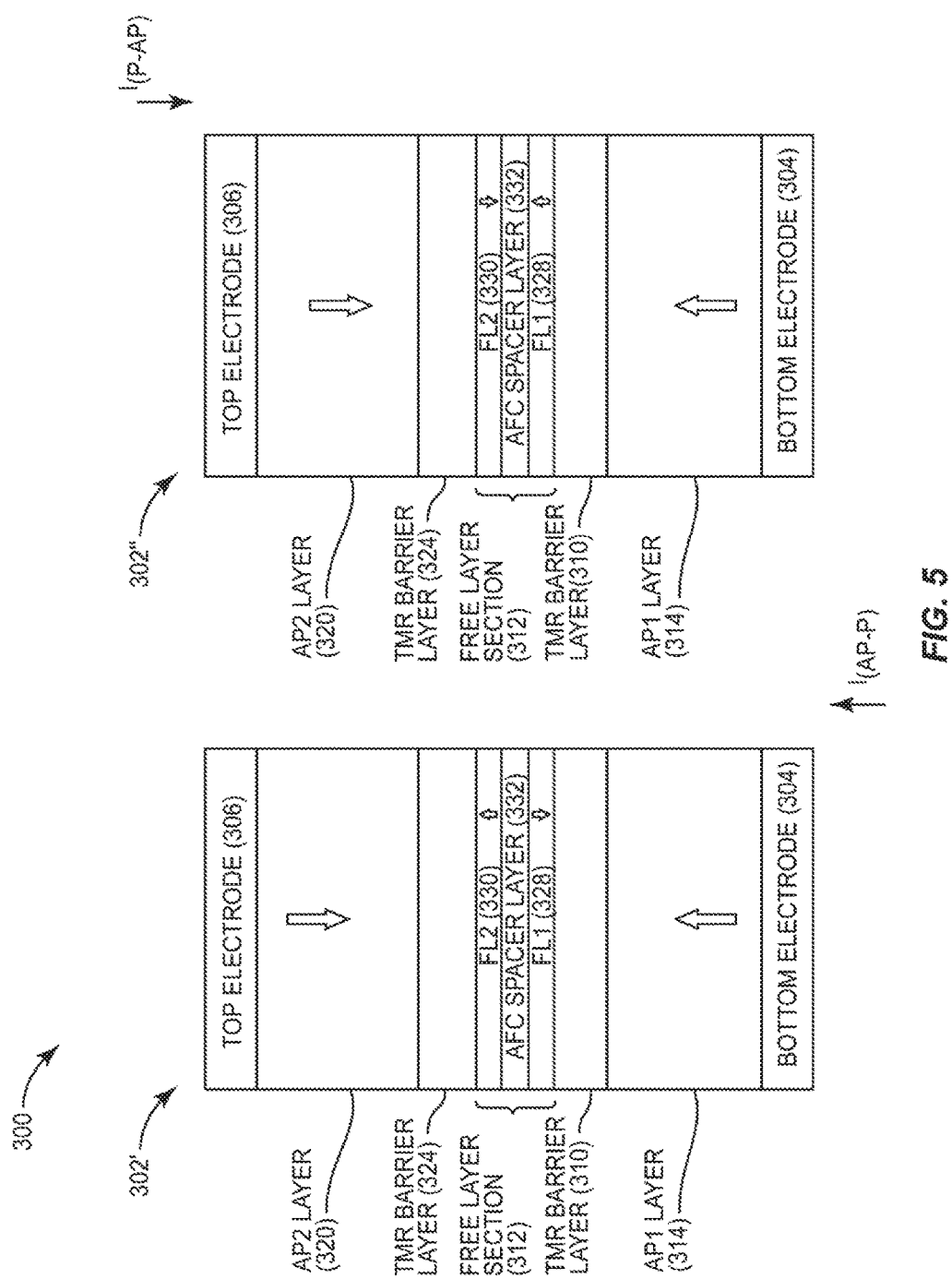
FIG. 5 is a schematic diagram illustrating the magnetization of an exemplary MTJ stack structure illustrated in FIG. 3, under an anti-parallel state and a parallel state.

In this regard, FIG. 5 is a schematic diagram illustrating the magnetization of the exemplary MTJ stack structure 302 illustrated in FIG. 3, under the AP state (structure 302') and the P state (structure 302"). If the combination of the AP1 layer 314 and the AP2 layer 320 has a net magnetic orientation in the "up" direction, when switching the MTJ stack structure 302 from the AP state to the P state (i.e., switching the magnetic orientation of the free layer section 312, and more specifically, of the free layer FL1 328, from the "down" direction to the "up" direction), $I_{AP\text{-}P}$ flows from the bottom electrode 304 towards the top electrode 306. The electrons in $I_{AP\text{-}P}$ become polarized in the "up" direction as they move through the AP1 layer 314 and the first TMR barrier layer 310 towards the free layer section 312, and when they bounce off the second TMR barrier layer 324. Because both the AP1 layer 314, the first TMR barrier layer 310, and the second TMR barrier layer 324 contribute to the "up" polarization of the electrons, the polarization is generally efficient for switching the free layer section 312 from the "down" polarization to the "up" polarization and thus the MTJ stack structure 302 from the AP state to the P state. As noted earlier, because the free layers FL1 328 and FL2 330 are anti-ferromagnetically coupled, and the free layer FL2 330 is softer than the free layer FL1 328, the free layer FL2 330 adopts a magnetic orientation that is opposite to, but weaker than, the magnetic orientation of the free layer FL1 328. The efficiency of switching the MTJ stack structure 302 from the AP state to the P state is therefore comparable, if not better, to the efficiency of switching the MTJ 100 in FIG. 1 from the AP state to the P state.

However, when switching the MTJ stack structure 302 from the P state to the AP state (i.e., switching the magnetic orientation of the free layer section 312, and more specifically, of the free layer FL1 328, from the "up" direction to the "down" direction), $I_{P\text{-}AP}$ flows from the top electrode 306 towards the bottom electrode 304. In the MTJ stack structure 302, contrary to the MTJ 100 in FIG. 1, the electrons in $I_{P\text{-}AP}$ become polarized in the "down" direction as they move through the AP2 layer 320 and the second TMR barrier layer 324 towards the free layer section 312, and when they bounce off the first TMR barrier layer 310. Thus, contrary to the MTJ 100 in FIG. 1, in the MTJ stack structure 302, the AP2 layer 320, the second TMR barrier layer 324, and the first TMR barrier layer 310 provide additional and more efficient sources of spin-polarization and thus enhance switching of the free layer section 312 from the P state to the AP state. Accordingly, this process is more efficient than when switching from the P state to the AP state in the MTJ 100 of FIG. 1, making $I_{P\text{-}AP}$ in the MTJ stack structure 302 smaller than $I_{P-AP}$ in the MTJ 100. Therefore, in the MTJ stack structure 302, $I_{P-AP}$ is closer to $I_{AP-P}$ than in the MTJ 100, thus providing for a reduced write current asymmetry relative to that in the MTJ 100.

Figure 6:
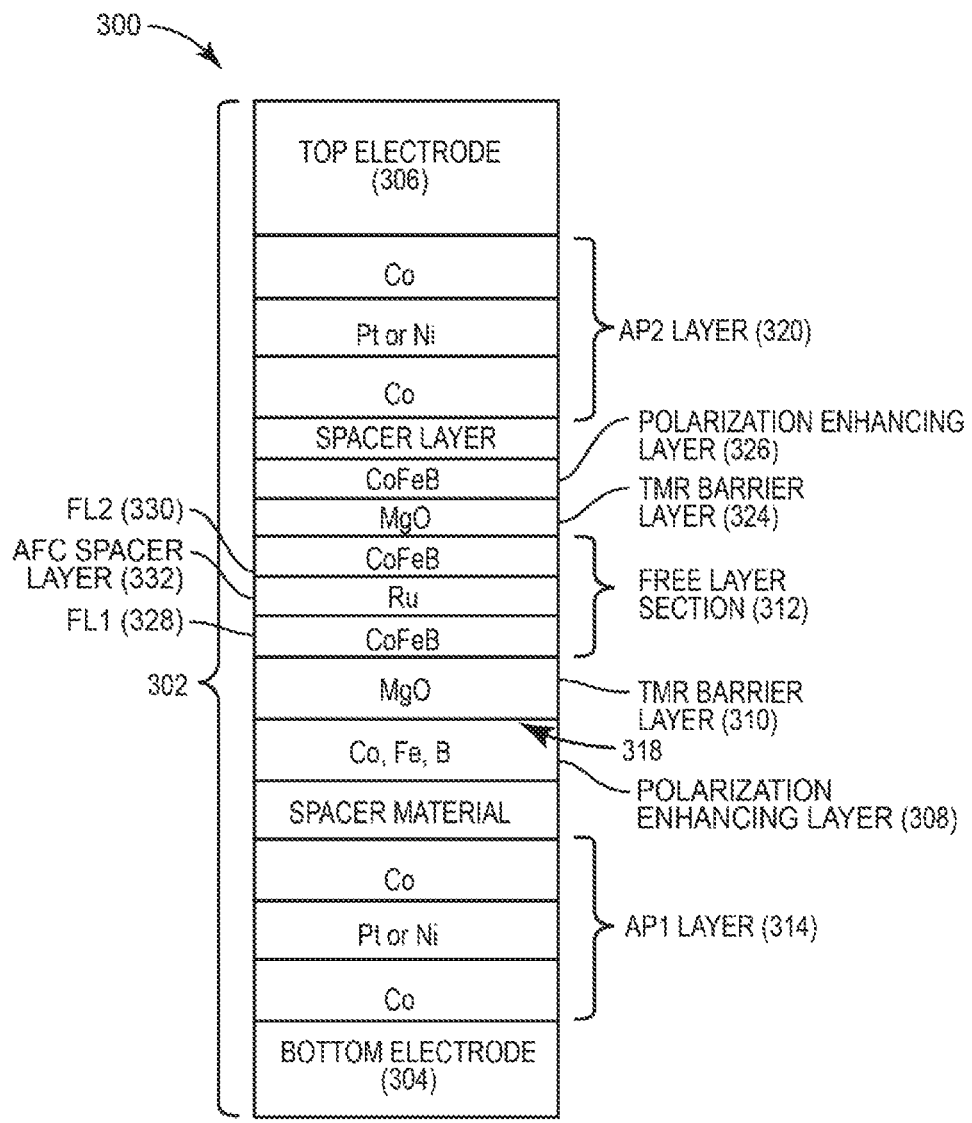
FIG. 6 is a schematic diagram illustrating a detailed stack structure of the exemplary MTJ illustrated in FIG. 3.

FIG. 6 is a schematic diagram illustrating a detailed stack structure of the exemplary MTJ 300 illustrated in FIG. 3. As discussed earlier, the thicker the material layers that are located under the first TMR barrier layer 310, the more likely "roughness" will be present at the base 318 of the first TMR barrier layer 310. Because the first TMR barrier layer 310 is a relatively thin layer (e.g., 5-10 angstroms), any roughness at the base 318 may degrade the functionality of the exemplary MTJ stack structure 302 illustrated in FIG. 3 by reducing a corresponding TMR ratio.

In this regard, the MTJ stack structure 302 includes the AP1 layer 314 and the polarization enhancing layer 308 below the first TMR barrier layer 310, and the AP2 layer 320 is provided above the first TMR barrier layer 310. The materials that form the polarization enhancing layer 308 are Cobalt (Co), Iron (Fe), and Boron (B). The materials that form the AP1 and AP2 layers 314, 320 are Cobalt (Co) and Platinum (Pt) or Cobalt (Co) and Nickel (Ni). In some aspects, the AP1 and AP2 layers 314, 320 may be formed by perpendicular alloys such as Cobalt (Co)/Palladium (Pd), Iron (Fe)/Boron (B), Cobalt (Co)/Iron (Fe)/Nickel (Ni), Cobalt (Co)/Iron (Fe)/Boron (B), Tantalum (Ta)/Iron (Fe)/ Cobalt (Co), Gadolinium (Gd)/Iron (Fe), Gadolinium (Gd)/ Iron (Fe)/Cobalt (Co), Cobalt (Co)/Iron (Fe), other ternary alloys, or rare earth materials, for example.

In the MTJ stack structure 302, because fewer materials are deposited under the first TMR barrier layer 310, the base 318 of the first TMR barrier layer 310 is likely to be less rough than the base 318 of the TMR barrier layer 212 in the MTJ stack structure 202 illustrated in FIG. 2. Thus, the MTJ stack structure 302 is likely to provide a higher TMR ratio than the MTJ stack structure 202 illustrated in FIG. 2.

With continued reference to FIG. 6, the MTJ stack structure 302 further comprises the second TMR barrier layer 324, which is similar in composition to the first TMR barrier layer 310, and the corresponding polarization enhancing layer 326, which is similar in composition to the polarization enhancing layer 308. The MTJ stack structure 302 further includes the free layer section 312, comprising the free layers FL1 328, FL2 330, each comprising, for example, a combination of Cobalt, Iron, and Boron (CoFeB). However, the disclosure is not so limited, and the free layer section 312 may comprise other combinations in which a magnetic orientation therein may be switched through exposure to spin-polarized electrons. As noted earlier, in one aspect, the magnetic anisotropy of the free layers FL1 328, FL2 330 differs, and may be reliably altered by, for example, varying the thickness and/or the alloy composition (i.e., the combination of elements Cobalt, Iron, and Boron) of one of the free layers FL1 328, FL2 330 relative to the other. As an example, not as limitation, the first magnetic anisotropy of the free layer FL1 328 can be set to a Hk effective value that is 1000 units higher than the second magnetic anisotropy of the free layer FL2 330, and thus the magnetic orientation of FL1 328 is harder to switch (i.e., requires a larger spin torque/write current to switch from a magnetic orientation to an opposite magnetic orientation) than the free layer FL2 330. As a result, the magnetic orientation of the free layer FL1 328 becomes "hard" relative to the "soft" magnetic orientation of the free layer FL2 330 and provides the magnetic orientation of the free layer section 312. The free layers FL1 328, FL2 330 are separated by the AFC spacer layer 332, thus making them anti-ferromagnetically coupled. The AFC spacer layer 332 comprises, for example, Ruthenium (Ru).

The MTJ stack structure 302 further includes the first and second TMR barrier layers 310, 324, which comprise, for example, a combination of Magnesium Oxide (MgO). However, the disclosure is not so limited, and other combinations providing an insulator with magneto-resistance properties when combined with adjacent ferromagnets may be used.

Figure 7:
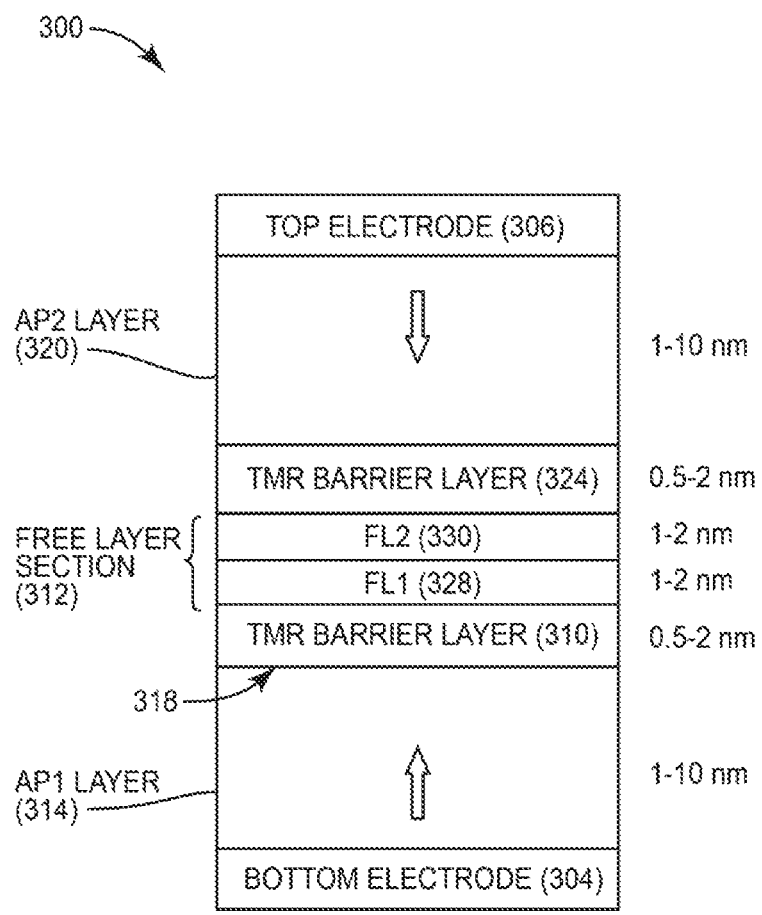
FIG. 7 is a schematic diagram illustrating exemplary dimensions for the exemplary MTJ illustrated in FIG. 3.

FIG. 7 is a schematic diagram illustrating exemplary dimensions for the exemplary MTJ 300 in FIG. 3. FIG. 7 will be described with reference to FIG. 3. As is illustrated in FIG. 7, in the MTJ 300, each of the AP1 and AP2 layers 314, 320 can have a width of between one (1) and ten (10) nanometers (nm). The first and second TMR barrier layers 310, 324 can each have a width of between 0.5 and two (2) nm Each of the free layers FL1 328, FL2 330 of the free layer section 312 can have a width of between one (1) and two (2) nm. Thus, in exemplary aspects, by providing one AP1 layer 314 below the first TMR barrier layer 310, the thickness of the material deposited below the first TMR barrier layer 310 can be reduced to between one (1) to ten (10) nm. This reduces the probability and/or the degree of roughness at the base 318 of the first TMR barrier layer 310, thus increasing the probability of having a high TMR ratio relative to that of a MTJ stack structure such as the MTJ stack structure 202 illustrated in FIG. 2.

Figure 8:
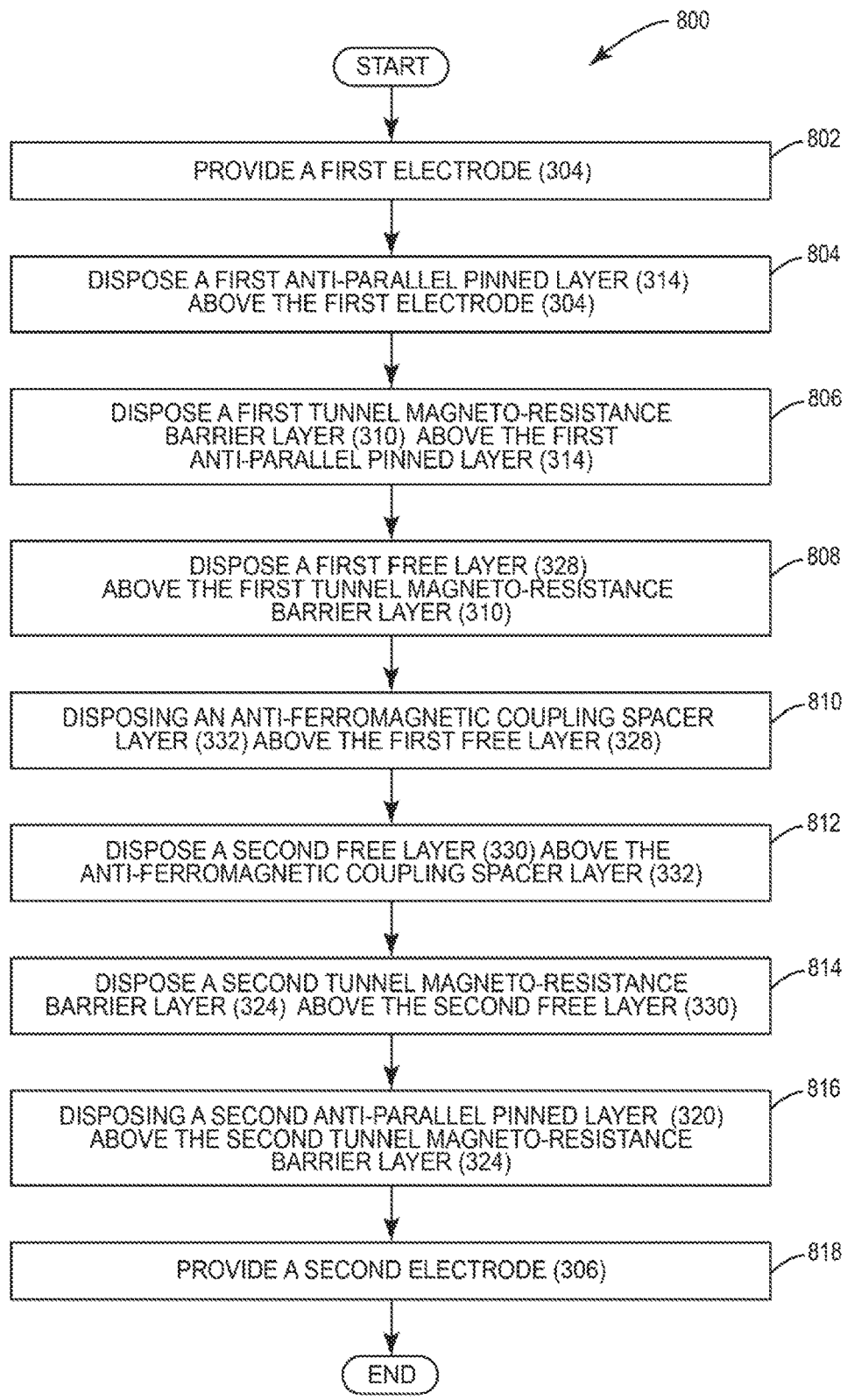
FIG. 8 is a flowchart illustrating a process of forming an exemplary MTJ according to an aspect of the disclosure.

FIG. 8 is a flowchart illustrating an exemplary process 800 of forming an exemplary MTJ according to an aspect of the disclosure. The exemplary process 800 will be discussed in regard to forming the MTJ 300 illustrated in FIG. 3. The exemplary process 800 starts by providing a first electrode (bottom electrode) 304 (block 802) and disposing a first AP pinned layer (AP1 layer) 314 above the first electrode 304 (block 804). A first TMR barrier layer 310 is disposed above the first AP pinned layer 314 (block 806). A free layer section 312 is disposed above the first TMR barrier layer 310, wherein disposing the free layer section 312 includes disposing a first free layer 328 above the first TMR barrier layer 310 of a first magnetic anisotropy (block 808), disposing an anti-ferromagnetic coupling (AFC) spacer layer 332 above the first free layer 328 (block 810), and disposing a second free layer 330 above the AFC spacer layer 332 of a second magnetic anisotropy that is different from the first magnetic anisotropy (block 812).

The first and second heterogeneous layers are heterogeneous by virtue of having different magnetic anisotropies relative to each other. The anti-ferromagnetic coupling caused by the AFC spacer layer 332 forces the heterogeneous layer with the lowest magnetic anisotropy (referred to also as a "soft" layer) (e.g., the second free layer 330) to adopt a magnetic orientation that is opposite to that of the heterogeneous layer with the highest magnetic anisotropy (referred to also as a "hard" layer) (e.g., the first free layer 328). Accordingly, the configuration set forth in blocks 808, 810, and 812 will cause the free layer section 312, as a whole, to respond to magnetic fields and polarized current by altering the hard layer and by allowing the soft layer to naturally become anti-parallel to the hard layer through the anti-ferromagnetic coupling, which will result in the free layer section 312 having a net magnetic orientation parallel to that of the hard layer. As noted earlier, this configuration obviates the need to fabricate the MTJ 300 such that the first TMR barrier layer 310 and the second TMR barrier layer 324 disposed above the free layer section 312 (block 814) are of different magneto-resistances, thus reducing complexity and increasing structural symmetry while allowing for the orientation of the free layer section 312, and thus the data stored therein, to be detected.

With continuing reference to FIG. 8, the exemplary process 800 further includes disposing a second AP pinned layer 320 above the second TMR barrier layer 324 (block 816) and ends by providing a second electrode (top electrode) 306 above the second AP pinned layer 320 (block 818). Accordingly, the exemplary process 800 yields an MTJ 300 where the first TMR barrier layer 310 is disposed between the first electrode 304 and the second electrode 306, where the first AP pinned layer 314 is disposed between the first TMR barrier layer 310 and the first electrode 304, and where the free layer section 312 is disposed between the second electrode 306 and the first TMR barrier layer 310. The free layer section 312 includes the first free layer 328, the second free layer 330, and the AFC spacer layer 332 between the first free layer 328 and the second free layer 330. Furthermore, the MTJ 300 includes the second AP pinned layer 320 disposed between the second electrode 306 and the free layer section 312, and the second TMR barrier layer 324 between the second AP pinned layer 320 and the free layer section 312.

Figure 9:
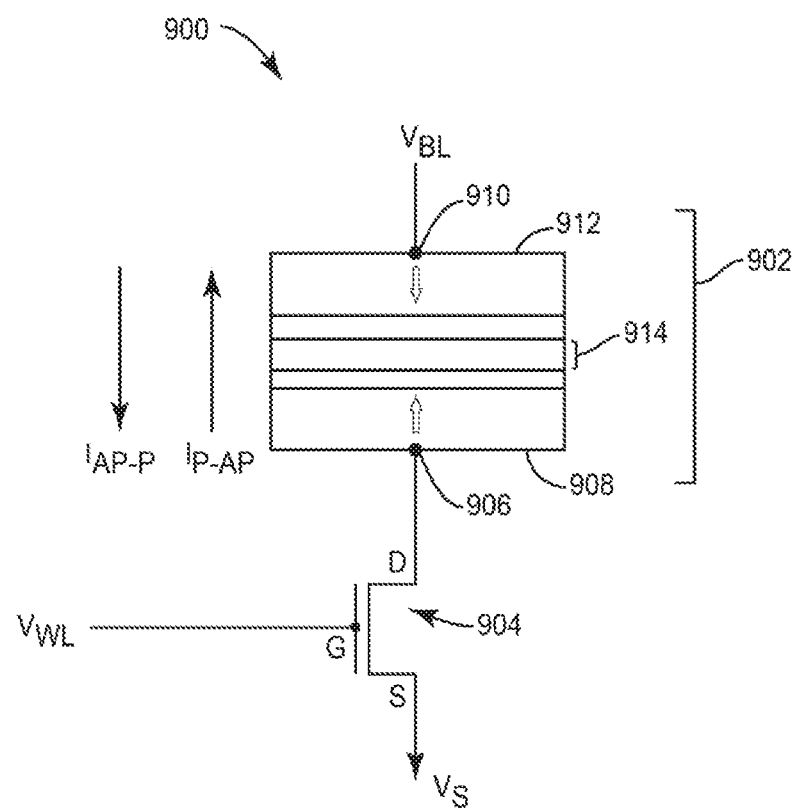
FIG. 9 is a schematic diagram of a MRAM bit cell that includes a MTJ similar to the exemplary MTJ illustrated in FIG. 3.

FIG. 9 is a schematic diagram of a MRAM bit cell 900 that includes a MTJ 902 similar to the exemplary MTJ 300 illustrated in FIG. 3. The MRAM bit cell 900 may be provided in a memory array and used as memory storage for any type of system requiring electronic memory, such as a central processing unit (CPU) or a processor-based system, as examples. An access transistor 904, which is an n-type metal-oxide semiconductor (NMOS) transistor in this example (referred to hereafter as "NMOS access transistor 904") is provided to control reading and writing to the MTJ 902. A drain (D) of the NMOS access transistor 904 is coupled to a bottom electrode 906 of the MTJ 902, which is coupled to a first pinned layer 908. A word line ($V_{WL}$) is coupled to a gate (G) of the NMOS access transistor 904. A source (S) of the NMOS access transistor 904 is coupled to a voltage source ($V_S$). A bit line ($V_{BL}$) is coupled to a top electrode 910 of the MTJ 902, which is coupled to a second pinned layer 912. A free layer section 914 is located between the first pinned layer 908 and the second pinned layer 912.

When reading data stored in the MTJ 902, the bit line ($V_{BL}$) is activated by the NMOS access transistor 904 to allow current to flow through the MTJ 902 between the top and bottom electrodes 910, 906. A low resistance, as measured by voltage applied on the bit line ($V_{BL}$) divided by the measured current, is associated with a P orientation between the free layer section 914 and the net magnetic orientation of the first and second pinned layers 908, 912, i.e., a P state. A higher resistance is associated with an AP orientation between the free layer section 914 and the net magnetic orientation of the first and second pinned layers 908, 912, i.e., an AP state. When writing data to the MTJ 902, the gate (G) of the NMOS access transistor 904 is activated by activating the word line ($V_{WL}$). A voltage differential between the bit line ($V_{BL}$) and the voltage source ($V_S$) is applied. As a result, a write current (I) (not shown) is generated between the drain (D) and the source (S). If the state of the MTJ 902 is to be changed from AP to P, a write current ($I_{AP-P}$) flowing from the top electrode 910 to the bottom electrode 906 is generated, which induces a spin-torque-transfer (STT) at the free layer section 914 to change the magnetic orientation of the free layer section 914 to a P state with respect to the net magnetic orientation of the first and second pinned layers 908, 912. If the state of the MTJ 902 is to be changed from a P state to an AP state, a current ($I_{P-AP}$) flowing from the bottom electrode 906 to the top electrode 910 is produced, which induces a STT at the free layer section 914 to change the magnetic orientation of the free layer section 914 to an AP state with respect to the net magnetic orientation of the first and second pinned layers 908, 912.

MTJ devices particularly suited for efficient STT MRAM according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
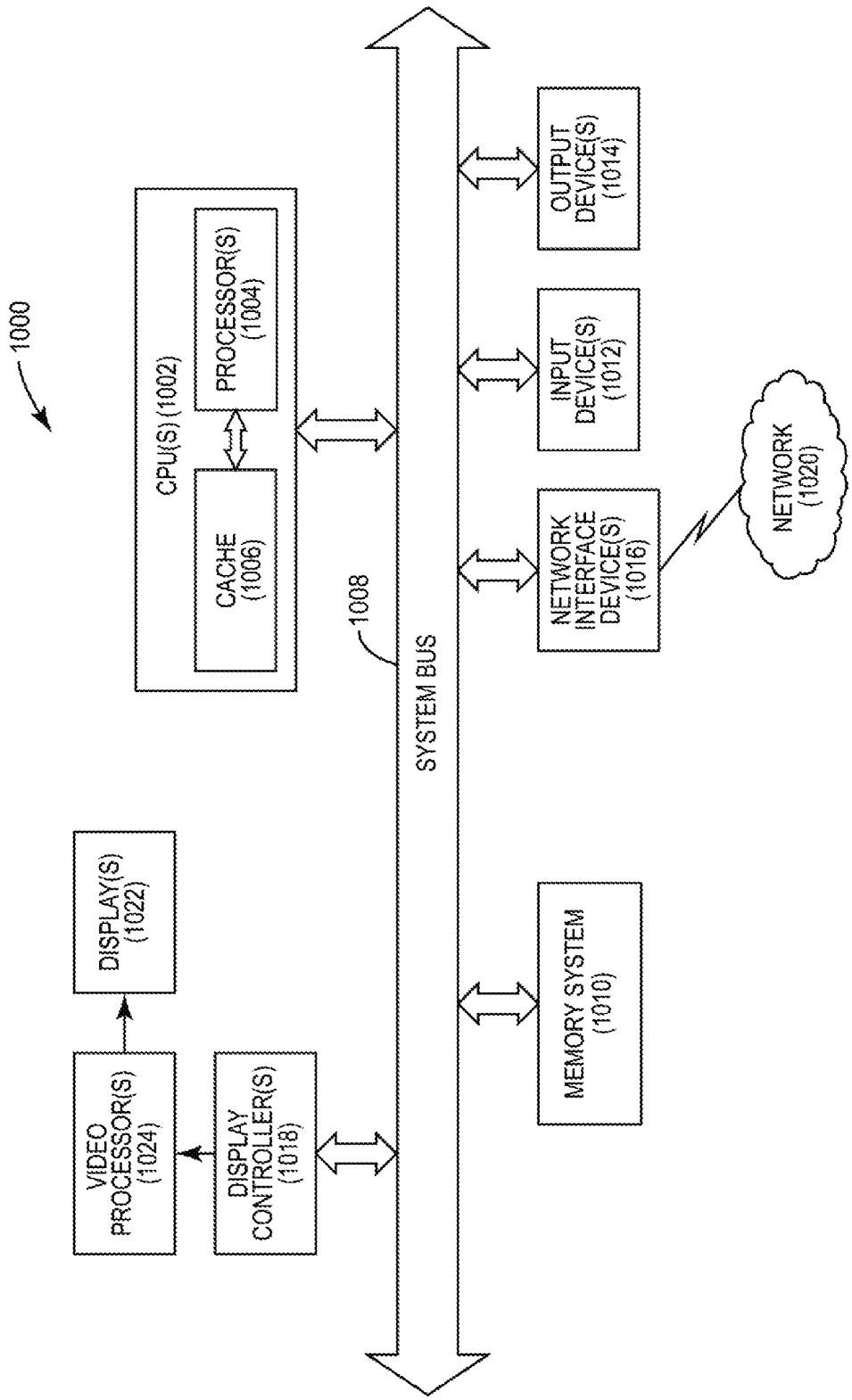
FIG. 10 is a block diagram of an exemplary processor-based system that can include the exemplary MTJ illustrated in FIG. 3.

In this regard, FIG. 10 illustrates an example of a processor-based system 1000 that can employ a MTJ according to aspects of the disclosure, such as the MTJ 300 illustrated in FIG. 3. In this example, the processor-based system 1000 includes one or more CPUs 1002, each including one or more processors 1004. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory system 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include the memory system 1010, one or more input devices 1012, one or more output devices 1014, one or more network interface devices 1016, and one or more display controllers 1018, as examples. The input device(s) 1012 can include any type of input device, including but not limited to input keys, switches, voice processors, etc. The output device(s) 1014 can include any type of output device, including but not limited to audio, video, other visual indicators, etc. The network interface device(s) 1016 can be any devices configured to allow exchange of data to and from a network 1020. The network 1020 can be any type of network, including but not limited to, a wired or wireless network, a private or public network, a local area network (LAN), a wireless local area network (WLAN), a wide area network (WAN), a BLUETOOTH™ network, and the Internet. The network interface device(s) 1016 can be configured to support any type of communications protocol desired.

The CPU(s) 1002 may also be configured to access the display controller(s) 1018 over the system bus 1008 to control information sent to one or more displays 1022. The display controller(s) 1018 sends information to the display(s) 1022 to be displayed via one or more video processors 1024, which processes the information to be displayed into a format suitable for the display(s) 1022. The display(s) 1022 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magnetic tunnel junction (MTJ), comprising:
   a first electrode and a second electrode;
   a first tunnel barrier layer between the first electrode and the second electrode, the first tunnel barrier layer configured to provide a first magneto-resistance between a first pinned layer and a free layer section when the first pinned layer is anti-parallel to the free layer section;
   the first pinned layer between the first tunnel barrier layer and the first electrode, the first pinned layer configured to provide a first magnetization in a first magnetic orientation between the first tunnel barrier layer and the first electrode;
   the free layer section between the second electrode and the first tunnel barrier layer, the free layer section comprising:
      a first free layer having a first magnetic anisotropy and having a first free layer magnetic orientation;
      a second free layer having a second magnetic anisotropy of a lower amplitude than an amplitude of the first magnetic anisotropy based on at least one of: a difference in a thickness between the first free layer and the second free layer, or a difference in composition of material between the first free layer and the second free layer, the second free layer having a second free layer magnetic orientation; and
      an anti-ferromagnetic coupling layer between the first free layer and the second free layer anti-ferromagnetically coupling the first free layer and the second free layer, such that the second free layer magnetic orientation of the second free layer is always forced substantially anti-parallel to the first free layer magnetic orientation of the first free layer based on a difference in amplitude between the first magnetic anisotropy and the second magnetic anisotropy, wherein the first free layer magnetic orientation has a hard magnetic orientation, and the second free layer magnetic orientation has a soft magnetic orientation;
   a second pinned layer between the second electrode and the free layer section, the second pinned layer configured to have a second magnetization in a second magnetic orientation that is anti-parallel to the first magnetic orientation; and
   a second tunnel barrier layer between the second pinned layer and the free layer section, the second tunnel barrier layer configured to have a second magneto-resistance between the second pinned layer and the free layer section when the second pinned layer is anti-parallel to the free layer section.

2. The MTJ of claim 1, wherein each of the first tunnel barrier layer and the second tunnel barrier layer comprises Magnesium Oxide (MgO).

3. The MTJ of claim 2, wherein each of the first tunnel barrier layer and the second tunnel barrier layer has a width of between 0.5 and two (2) nanometers (nm).

4. The MTJ of claim 1, wherein the first magneto-resistance of the first tunnel barrier layer is substantially similar to the second magneto-resistance of the second tunnel barrier layer.

5. The MTJ of claim 1, wherein the first pinned layer comprises only one magnetic layer, the one magnetic layer comprising at least one of a Cobalt (Co)/Nickel (Ni) alloy, a Co/Palladium (Pd) alloy, an Iron (Fe)/Boron (B) alloy, a Co/Platinum (Pt) alloy, a Gadolinium (Gd)/Fe alloy, a Co/Fe alloy, a Co/Fe/B alloy, or a Tantalum (Ta)/Fe/Co alloy.

6. The MTJ of claim 5, wherein the first pinned layer has a width of between one (1) and ten (10) nanometers (nm).

7. The MTJ of claim 1, wherein the first pinned layer comprises only one magnetic layer, the one magnetic layer comprising Co and Pt.

8. The MTJ of claim 7, wherein the first pinned layer has a width of between one (1) and ten (10) nanometers (nm).

9. The MTJ of claim 1, wherein the first pinned layer has a width of between one (1) and ten (10) nanometers (nm).

10. The MTJ of claim 1, wherein the first magnetic orientation of the first magnetization of the first pinned layer is perpendicular to a plane of the first pinned layer and wherein the second magnetic orientation of the second magnetization of the second pinned layer is perpendicular to a plane of the second pinned layer.

11. The MTJ of claim 1, wherein each of the first free layer and the second free layer comprises a Co, Fe, and B (CoFeB) alloy composition.

12. The MTJ of claim 11, wherein the difference between the first magnetic anisotropy and the second magnetic anisotropy is based on the difference in composition of the CoFeB alloy composition between the first free layer and the second free layer.

13. The MTJ of claim 1 integrated into an integrated circuit (IC).

14. The MTJ of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

15. A method of forming a magnetic tunnel junction (MTJ), comprising:
providing a first electrode and a second electrode;
disposing a first tunnel barrier layer between the first electrode and the second electrode;
disposing a first pinned layer between the first tunnel barrier layer and the first electrode;
disposing a free layer section between the second electrode and the first tunnel barrier layer, the free layer section comprising:
a first free layer having a first magnetic anisotropy and having a first free layer magnetic orientation;
a second free layer having a second magnetic anisotropy of a lower amplitude than an amplitude of the first magnetic anisotropy based on at least one of: a difference in a thickness between the first free layer and the second free layer, or a difference in composition of material between the first free layer and the second free layer, the second free layer having a second free layer magnetic orientation; and
an anti-ferromagnetic coupling layer between the first free layer and the second free layer anti-ferromagnetically coupling the first free layer and the second free layer, such that second free layer magnetic orientation of the second free layer is always forced substantially anti-parallel to the first free layer magnetic orientation of the first free layer based on a difference in amplitude between the first magnetic anisotropy and the second magnetic anisotropy, wherein the first free layer magnetic orientation has a hard magnetic orientation, and the second free layer magnetic orientation has a soft magnetic orientation;
disposing a second pinned layer between the second electrode and the free layer section; and
disposing a second tunnel barrier layer between the second pinned layer and the free layer section.

16. The method of claim 15, wherein disposing the first pinned layer between the first tunnel barrier layer and the first electrode comprises disposing at least one material such that the first pinned layer provides a magnetization in only one magnetic orientation between the first tunnel barrier layer and the first electrode.

17. A magnetic random access memory (MRAM) bit cell, comprising:
an access transistor having a gate, a source, and a drain; and
a magnetic tunnel junction (MTJ), comprising:
a first electrode and a second electrode;
a first tunnel barrier layer between the first electrode and the second electrode, the first tunnel barrier layer configured to provide a first magneto-resistance between a first pinned layer and a free layer section when the first pinned layer is anti-parallel to the free layer section;
the first pinned layer between the first tunnel barrier layer and the first electrode, the first pinned layer configured to provide a first magnetization in a first magnetic orientation between the first tunnel barrier layer and the first electrode;
the free layer section between the second electrode and the first tunnel barrier layer, the free layer section comprising:
a first free layer having a first magnetic anisotropy and having a first free layer magnetic orientation;
a second free layer having a second magnetic anisotropy of a lower amplitude than an amplitude of the first magnetic anisotropy based on at least one of:
a difference in a thickness between the first free layer and the second free layer, or a difference in composition of material between the first free layer and the second free layer, the second free layer having a second free layer magnetic orientation; and
an anti-ferromagnetic coupling layer between the first free layer and the second free layer anti-ferromagnetically coupling the first free layer and the second free layer, such that second free layer magnetic orientation of the second free layer is always forced substantially anti-parallel to the first free layer magnetic orientation of the first free layer based on a difference in amplitude between the first magnetic anisotropy and the second magnetic anisotropy, wherein the first free layer magnetic orientation has a hard magnetic orientation, and the second free layer magnetic orientation has a soft magnetic orientation;

a second pinned layer between the second electrode and the free layer section, the second pinned layer configured to have a second magnetization in a second magnetic orientation that is anti-parallel to the first magnetic orientation; and a second tunnel barrier layer between the second pinned layer and the free layer section, the second tunnel barrier layer configured to have a second magneto-resistance between the second pinned layer and the free layer section when the second pinned layer is anti-parallel to the free layer section, wherein a word line is coupled to the gate, the second electrode is coupled to the drain, and a bit line is coupled to the first electrode.

18. The MRAM bit cell of claim 17, wherein each of the first tunnel barrier layer and the second tunnel barrier layer comprises Magnesium Oxide (MgO).

19. The MRAM bit cell of claim 18, wherein each of the first tunnel barrier layer and the second tunnel barrier layer has a width of between 0.5 and two (2) nanometers (nm).

20. The MRAM bit cell of claim 17, wherein each of the first free layer and the second free layer comprises Cobalt (Co), Iron (Fe), and Boron (B).

21. The MRAM bit cell of claim 20, wherein the difference between the first magnetic anisotropy and the second magnetic anisotropy is based on a difference in a CoFeB alloy composition between the first free layer and the second free layer.

22. The MRAM bit cell of claim 17 integrated in at least one semiconductor die.

23. The MRAM bit cell of claim 17 integrated into a device selected from a group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

24. A magnetic tunnel junction (MTJ), comprising:
a first electrode and a second electrode;
a first tunnel barrier layer between the first electrode and the second electrode, the first tunnel barrier layer comprising Magnesium Oxide (MgO);
a first pinned layer between the first tunnel barrier layer and the first electrode, the first pinned layer comprising at least one of a Cobalt (Co)/Nickel (Ni) alloy, a Co/Palladium (Pd) alloy, an Iron (Fe)/Boron (B) alloy, a Co/Platinum (Pt) alloy, a Gadolinium (Gd)/Fe alloy, a Co/Fe alloy, a Co/Fe/B alloy, or a Tantalum (Ta)/Fe/Co alloy, and configured to have a first magnetization in a first magnetic orientation between the first tunnel barrier layer and the first electrode;

a free layer section between the second electrode and the first tunnel barrier layer, the free layer section comprising:
a first free layer comprising Co, Fe, and B and having a first magnetic anisotropy and having a first free layer magnetic orientation;
a second free layer comprising Co, Fe, and B, and having a second magnetic anisotropy of a lower amplitude than an amplitude of the first magnetic anisotropy based on at least one of: a difference in a thickness between the first free layer and the second free layer, or a difference in composition of material between the first free layer and the second free layer, the second free layer having a second free layer magnetic orientation wherein the first free layer magnetic orientation has a hard magnetic orientation, and the second free layer magnetic orientation has a soft magnetic orientation; and
an anti-ferromagnetic coupling layer comprising Ruthenium (Ru) between the first free layer and the second free layer anti-ferromagnetically coupling the first free layer and the second free layer, such that second free layer magnetic orientation of the second free layer is always forced substantially anti-parallel to the first free layer magnetic orientation of the first free layer based on a difference in amplitude between the first magnetic anisotropy and the second magnetic anisotropy; and a second pinned layer between the second electrode and the free layer section, the second pinned layer configured to have a second magnetization in a second magnetic orientation that is anti-parallel to the first magnetic orientation.

25. The MTJ of claim 24, wherein the first tunnel barrier layer has a width of between 0.5 and two (2) nanometers (nm).

26. The MTJ of claim 24, further comprising a second tunnel barrier layer between the second pinned layer and the free layer section, the second tunnel barrier layer comprising MgO.

27. The MTJ of claim 24, wherein the first pinned layer has a width of between one (1) and ten (10) nanometers (nm).

* * * * *